(12) United States Patent  (10) Patent No.: US 7,609,165 B2
Sharma  (45) Date of Patent: Oct. 27, 2009

(54) METHOD AND APPARATUS FOR MAGNETICALLY ACTIVATED RADIO OR INFRARED IDENTIFICATION SYSTEM

(75) Inventor: Raman Kumar Sharma, Toronto (CA)

(73) Assignee: Tyco Safety Products Canada Ltd., Concord, Ontario (CA)

( * ) Notice: Subject to any disclaimer, the term of this patent is extended or adjusted under 35 U.S.C. 154(b) by 363 days.

(21) Appl. No.: 11/588,762

(22) Filed: Oct. 27, 2006

(65) Prior Publication Data

US 2008/0100448 A1 May 1, 2008

(51) Int. Cl.
*G08B 13/14* (2006.01)
(52) U.S. Cl. .............. 340/572.8; 340/572.3; 340/572.6; 340/568.1; 340/540
(58) Field of Classification Search .............. 340/572.7, 340/572.8, 572.1, 572.6, 572.3, 568.1, 539.16, 340/539.17, 539.14, 539.1, 506, 539.13, 340/527, 528, 540; 343/876
See application file for complete search history.

(56) References Cited

U.S. PATENT DOCUMENTS

| 6,040,762 | A | 3/2000 | Tompkins |
| 6,618,022 | B2 * | 9/2003 | Harvey ........................ 343/876 |
| 6,930,604 | B2 * | 8/2005 | Marino .................. 340/539.16 |
| 7,239,238 | B2 | 7/2007 | Tester et al. |
| 7,445,550 | B2 * | 11/2008 | Barney et al. ................. 463/37 |
| 2006/0226948 | A1 | 10/2006 | Wright et al. |
| 2006/0279427 | A1 * | 12/2006 | Becker et al. ............ 340/573.4 |
| 2008/0007398 | A1 * | 1/2008 | DeRose et al. ......... 340/539.13 |

* cited by examiner

*Primary Examiner*—Anh V La
(74) *Attorney, Agent, or Firm*—The Small Patent Law Group LLP

(57) ABSTRACT

A disarming system for an RFID tag or an IRID tag having a magnetically operated sensor or switch includes a permanent magnet, wherein the permanent magnet is configured to activate the magnetically operated switch or sensor in the RFID tag or IRID tag when the RFID tag or IRID tag is brought into proximity of the permanent magnet. The disarming station also includes a receiving station configured to disarm a security system when the magnetically operated switch or sensor in the RFID tag or IRID tag is activated.

24 Claims, 5 Drawing Sheets

METHOD AND APPARATUS FOR MAGNETICALLY ACTIVATED RADIO OR INFRARED IDENTIFICATION SYSTEM

BACKGROUND OF THE INVENTION

This invention relates generally to electronic security systems, and more particularly, to methods and apparatus for implementing a security system having radio frequency identification (RFID) tags or infrared identification (IRID) tags, wherein the RFID or IRID tags have long life and low cost.

RFID tags are available in two basic versions, namely, "active" and "passive." Passive RFID tags have no internal power supply. Instead, an incoming radio signal provides just enough power to activate a CMOS integrated circuit (IC) in the tag. When activated, an outbound backscatter signal is transmitted back to the reader. This transmitted response can include an ID number or code, as well as other data. Passive RFID tags are relatively inexpensive, but the distance at which they can be read is limited, and relatively expensive readers are required.

On the other hand, active RFID tags use their own internal power source to power ICs and to transmit the outgoing signal. Because of the presence of an internal power source, these tags can transmit with greater power and range than can passive RFID tags. Thus, active RFID tags can be more reliable than passive RFID tags and have larger memories. However, all these advantages accrue at the expense of the RFID tag having a lifetime limited by the lifetime of the internal power source, which is always being drained by the transmitter.

Some alarm systems suitable for installation in a dwelling or a light commercial building use relatively inexpensive passive RFID tags, but, as a result, require many relatively expensive active readers. The cost of multiple readers is multiplied by the number of readers installed. These readers are already relatively expensive and processor intensive, and the readers drain a considerable amount of current. As the current requirement increases with the number of readers, the current requirement for the entire system increases as does the size of needed backup batteries.

Some other alarm systems suitable for use in the same types of buildings use active RFID tags and active read stations. Known active tags used in security systems contain batteries and RF receivers/detectors that consume large amounts of current. Thus, the batteries contained therein last only one to three years, after which the RFID tags must be replaced.

BRIEF DESCRIPTION OF THE INVENTION

In one aspect, some configurations of the present invention provide a disarming system for an RFID tag or an IRID tag having a magnetically operated sensor or switch. The disarming system includes a permanent magnet, wherein the permanent magnet is configured to activate the magnetically operated switch or sensor in the RFID tag or IRID tag when the RFID tag or IRID tag is brought into proximity of the permanent magnet. The disarming station also includes a receiving station configured to disarm a security system when the magnetically operated switch or sensor in the RFID tag or IRID tag is activated.

In another aspect, some configurations of the present invention provide a security system. The security system includes a security controller configured to signal an alarm in response to a detection of an anomalous condition and at least one security sensor configured to indicate to the security controller that an anomalous condition has been detected. The security system further includes at least one RFID tag or IRID tag, wherein the RFID tag or IRID tag includes a transmitter, a memory containing data and operatively coupled to the transmitter to transmit the data, and a power source operatively coupled to the transmitter and memory through a magnetically operated switch or sensor to provide power to the transmitter and memory when the magnetically operated switch is in a sufficiently strong magnet field. The security system further includes at least one disarming station having a permanent magnet configured to operate the magnetically operated switch when the RFID tag or IRID tag is brought nearby and a receiving station configured to receive the transmitted data from the RFID tag or IRID tag to disarm the security controller.

In yet another aspect, some configurations of the present invention provide a method for operating a security system having a security controller configured to signal an alarm in response to a detection of an anomalous condition, and at least one security sensor configured to indicate to the security controller that an anomalous condition has been detected. The method includes bringing an RFID tag or IRID tag into proximity of a disarming station having a permanent magnet having a magnetic field, operating a magnetically-operated switch or sensor in the RFID tag or IRID tag using the magnetic field of the permanent magnet to thereby temporarily awaken the RFID tag or IRID tag into a full power mode, and transmitting a signal from the temporarily awakened RFID tag or IRID tag to a receiver to disarm the security controller. The method also includes removing the RFID tag or IRID tag from the proximity of the disarming station to thereby place the RFID tag or IRID tag into a lower or no power dormant state.

It will be appreciated that some configurations of the present invention therefore provide a security system having a long-lasting RFID or IRID tag that can transmit a signal a substantial distance or have another device relay its signal via radio, and yet last almost as long as the shelf life of the batteries used to power it. Because the batteries last throughout the useful life of the RFID or IRID tag, the tag becomes disposable at the end of life and there is no need to change batteries. Moreover, instead of having multiple readers for RFID tags, a single receiving station (or a small number of receiving stations) can be used, and active disarming stations can be replaced with completely passive disarming stations that each comprise a permanent magnet. As an alternative to replacement, existing disarming stations can be retrofitted with magnets.

Figure 1:
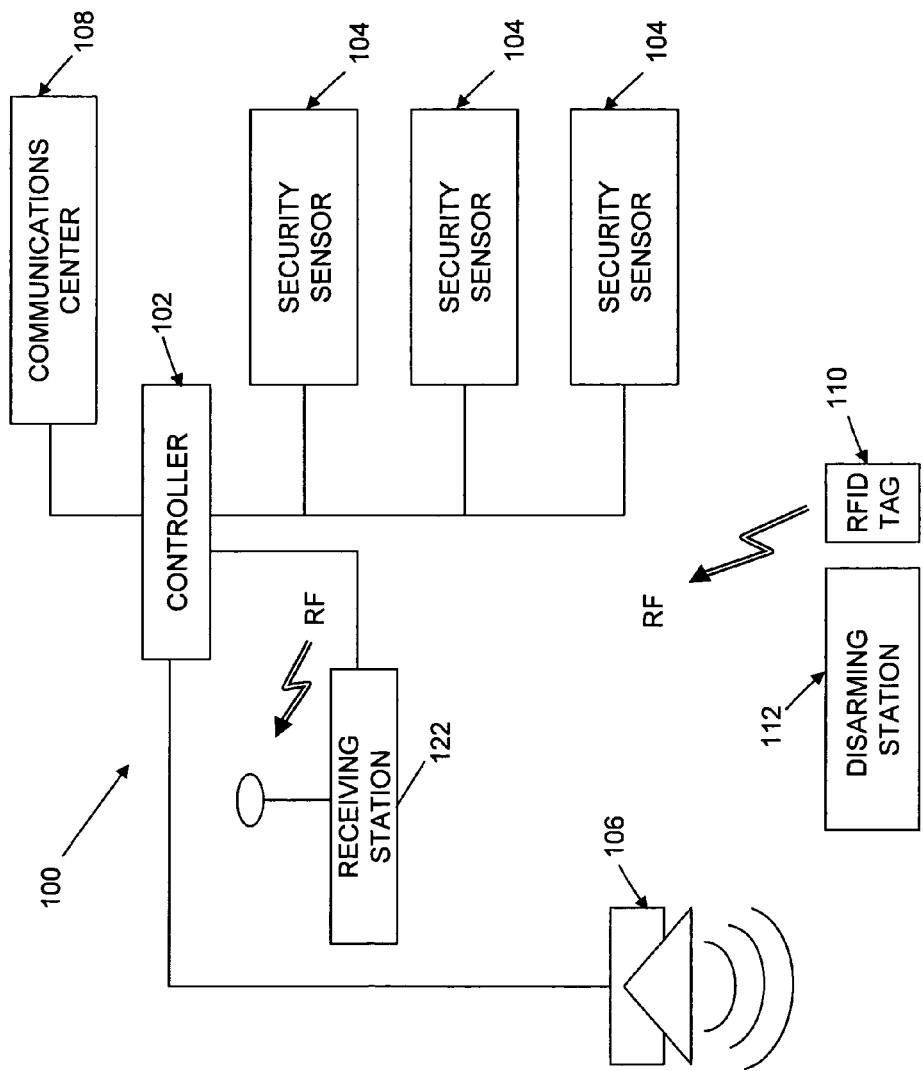
FIG. 1 is a block schematic drawing of a security system configuration of the present invention.

The foregoing summary, as well as the following detailed description of certain embodiments of the present invention, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or a block or random access memory, hard disk, or the like). Similarly, the programs may be stand alone programs, may be incorporated as subroutines in an operating system, may be functions in an installed software package, and the like. It should be understood that the various embodiments are not limited to the arrangements and instrumentality shown in the drawings.

DETAILED DESCRIPTION OF THE INVENTION

As used herein, an element or step recited in the singular and proceeded with the word "a" or "an" should be understood as not excluding plural said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

In some configurations of the present invention and referring to FIG. 1, a security system 100 may include a controller 102 and one or more security sensors 104. Security sensors 104 may include devices that detect contact breaks (e.g., sensors that detect door or window openings), glass breakage sensors, motion sensors, etc. Security sensors 104 communicate with controller 102 to raise an alarm when system 100 is armed and an anomalous condition has occurred, such as a door or window opening, the breakage of glass, or motion in a room. The mode of communication between security sensors 104 and controller 102 may be selected by one of ordinary skill in the art, and does not itself constitute part of this invention. For example, communication between security sensors 104 and controller 102 may be via wire, radio, light or infrared communication. Controller 102 responds to the detection of an anomalous condition by signaling an alarm, either locally using one or more local audible or visible alarms 106 and/or remotely at a communications center 108.

Disarming of alarm system 100 may be done at a controller 102 having a local or remote keypad (not shown in FIG. 1) in some configurations. However, in some configurations of the present invention, one or more RFID tags 110 are provided for disarming purposes along with one or more disarming stations 112. So that a disarming station distant from controller 102 can be used, and referring to FIG. 2, RFID tags 110 are provided with a power source such as a button-type lithium cell or battery 114 that powers a transmitter 116 and a memory 118. Memory 118 is operatively coupled to transmitter 116 so that data from memory 118 is transmitted by transmitter 116 using antenna 120 to a receiving station 122 (see FIG. 1) tuned to the frequency of transmitter 116. Although many different frequencies are useful for this purpose, an RF frequency of about 433 MHz can be used by transmitter 116 and receiving station 122, for example. (Under FCC rules, 433 MHz can be used by unlicensed devices to transmit data intermittently.) When a predetermined (i.e., authorized) signal (or one of several predetermined signals) is received by receiving station 122, receiving station 122 sends a signal to controller 102 (see FIG. 1) to disarm alarm system 100.

Figure 2:
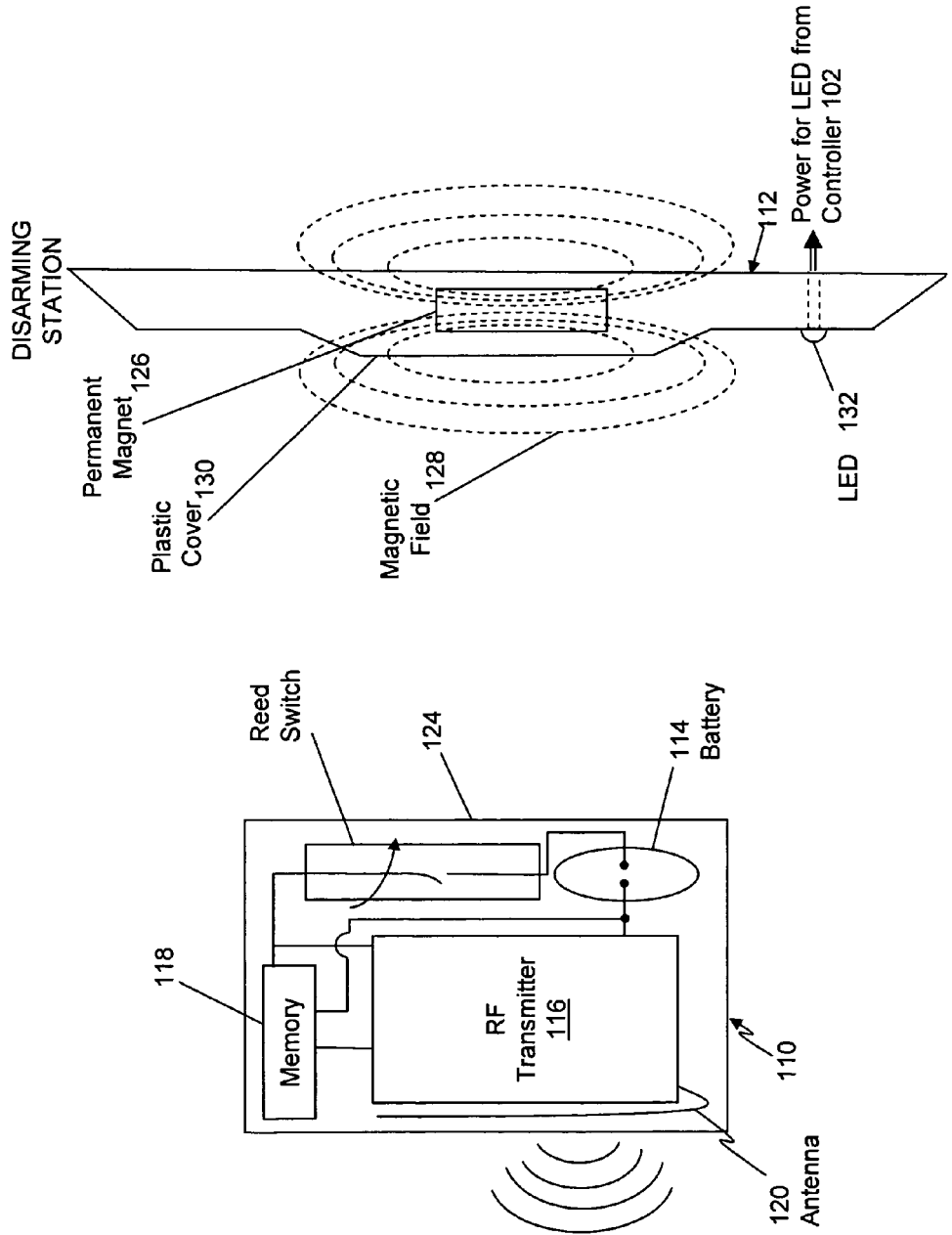
FIG. 2 is a more detailed pictorial diagram of an RFID card and disarming station useful in the security system configuration of FIG. 1.

Referring to FIG. 2, to lengthen the life of RFID tags 110 by preventing power source 114 from draining too quickly, RFID tags 110 can include a magnetically-operated switch or sensor 124 (such as a reed switch or a circuit comprising a Hall effect sensor, for example) to couple power source 114 to transmitter 116 and memory 118. Switch 124 is configured to place RFID tag 110 in a reduced power mode or an unpowered mode unless switch 124 is in a sufficiently strong magnetic field. At least one disarming station 112 includes a permanent magnet 126 having a magnetic field 128 strong enough to operate magnetically operated switch or sensor 124 when RFID tag 110 is brought into proximity of the disarming station 112. For example, permanent magnet 126 may be a relatively strong magnet (e.g., an alnico magnet or a samarium-cobalt magnet) under a non-magnetic (e.g., plastic) cover 130 of disarming station 112. Thus, switch or sensor 124 is activated when RFID tag 110 is brought into proximity of non-magnetic cover 130 of disarming station 112.

To disarm alarm system 100, memory 118 may be programmed with a unique serial number of RFID tag 110. When RFID tag 110 is activated by bringing it into proximity of disarming station 112, this unique serial number may comprise the data transmitted to receiving station 122 (see FIG. 1) that is recognized as a valid disarming signal. More than one RFID tag 110 may be used in an alarm system 100 (see FIG. 1), so a plurality of unique serial numbers may have to be recognized by receiving station 122 as valid disarming signals. Either alternately or additionally, memory 118 may be programmed with a disarm code that may vary between alarm systems 100. This disarm code may also be transmitted by an RFID tag 110 to disarm alarm system 100.

Referring again to FIG. 1, RFID tag 110 is not continuously awake, thereby conserving sufficient battery power so that, when it does awaken and transmit, a relatively high power level can be used. Thus, receiving station 122 and disarming station 112 can be located a considerable distance away from one another within a dwelling or a business. Moreover, there may a relatively large number of disarming stations 112. Thus, receiving station 122 may, for example, be advantageously placed at a centralized location or at a location near or even within controller 102, and disarming stations 112 need not consume nor be supplied with any power. As a result, no backup power is needed for disarming stations 112, and alarm system 100 can be made to operate for longer periods of time on a fixed amount of backup power.

In some configurations, some power is provided to disarming stations 112, at least to provide an audio or visual indicator (such as a piezoelectric alarm or an LED) 132 (see FIG. 2) to indicate the status of alarm system 100 (i.e., armed or disarmed). This status indication may be provided by an electric or electronic signal from controller 102, for example.

In some configurations, permanent magnet 126 can be retrofitted into an existing disarming station 112. In some retrofitted systems, no modification of existing controller 102 software and/or no modification of existing hardware is required other than installation of permanent magnet 126 and the replacement of RFID tags with RFID tags 110 configured as described herein.

In some configurations of the present invention and referring again to FIG. 2, a disarming station 112 for an RFID tag 110 having a magnetically operated switch or sensor 124 is provided. Disarming station 112 has a permanent magnet 126 and a non-magnetic cover 130. Permanent magnet 126 provides a magnetic field 128 that penetrates cover 130 so that magnet 126 can activate switch or sensor 124 in RFID tag 110 when RFID tag 110 is brought into proximity of non-magnetic cover 130.

In some configurations and referring to both FIGS. 1 and 2, a receiving station 122 is also provided. Receiving station 122 receives signals from RFID tag 110 when magnetically-operated switch or sensor 124 is activated and operates to disarm a security system 100. Receiving station 122 may be a separate device located some distance from disarming station 112 or it may be contained within or located adjacent to disarming station 112.

In contrast to configurations in which disarming station 112 contains a powered receiving station 122, disarming stations 112 in some configurations of the present invention contain no powered components themselves, but are installed in a building along with a receiving station 122 that receives signals from RFID tags 110 activated by any disarming station 112 within the building.

Figure 3:
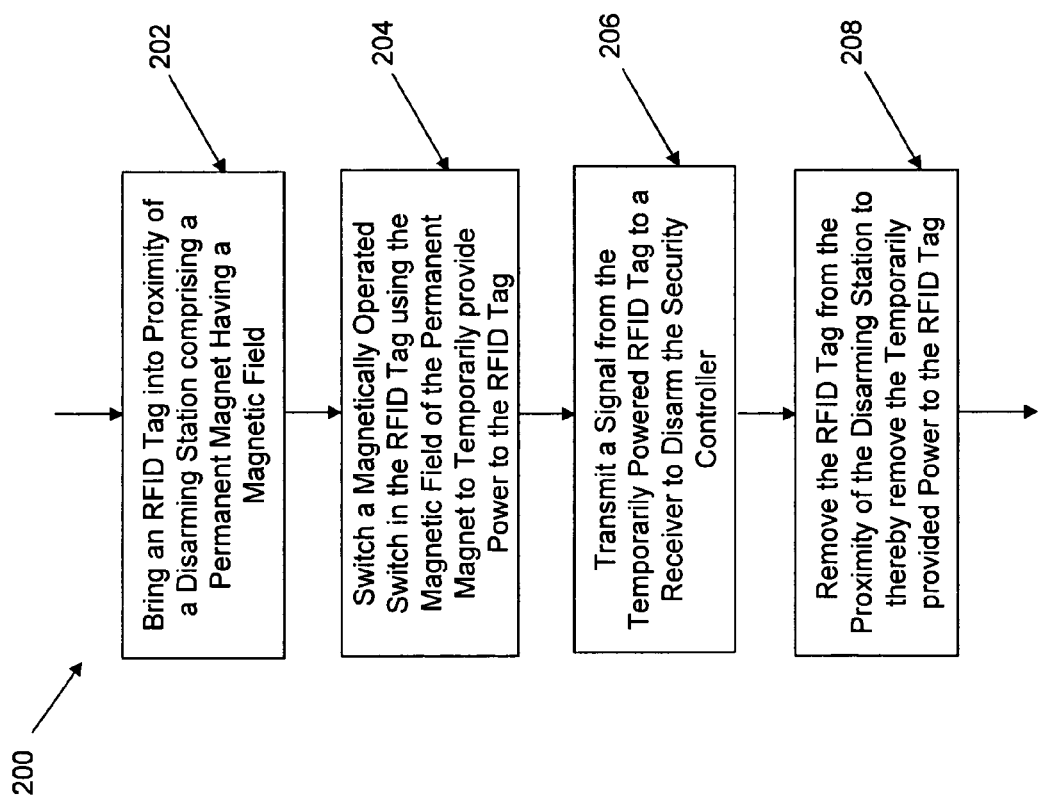
FIG. 3 is a block diagram of a method for operating the security system configuration of FIG. 1.

In some configurations and referring to flow chart 200 of FIG. 3 as well as FIGS. 1 and 2, a method for operating a security system 100 having a security controller 102 configured to signal an alarm 106 and/or 108 in response to a detection of an anomalous condition by at least one security sensor configured to detect the anomalous condition is provided. The method includes, at block 202, bringing an RFID tag 110 into proximity of a disarming station 112, wherein disarming station 112 includes a permanent magnet 126 having a magnetic field 128. Next, at block 204, a magnetically operated switch or sensor 124 in RFID tag 110 is operated using magnetic field 128 of permanent magnet 126. This switching results in RFID tag 110 being awakened, receiving full power from a power source 114 internal to RFID tag 110. Next, at block 206, this temporarily available full power results in a signal being transmitted from RFID tag 110 (e.g., at 433 MHz) to a receiver station 122 configured to disarm security controller 102. At block 208, the method also includes removing RFID tag 110 from the proximity of disarming station 112 to thereby deactivate switch or sensor 124 and deactivate RFID tag 110.

The magnetically operated switch or sensor 124 referred to at blocks 204 and 208 can be a reed switch or a Hall effect switch, for example, and the signal transmitted at block 206 can be a unique serial number of RFID tag 110 and/or a disarm code. In some configurations, disarming station 112 can be left completely unpowered, as it need only contain a permanent magnet 126 to activate magnetically controlled switch or sensor 124. The method may further include the step of retrofitting permanent magnet 126 into an existing disarming station 112. In some configurations, an indicator 132 may be provided in disarming station 112 and used to indicate the armed or disarmed status of security system 100.

Figure 4:
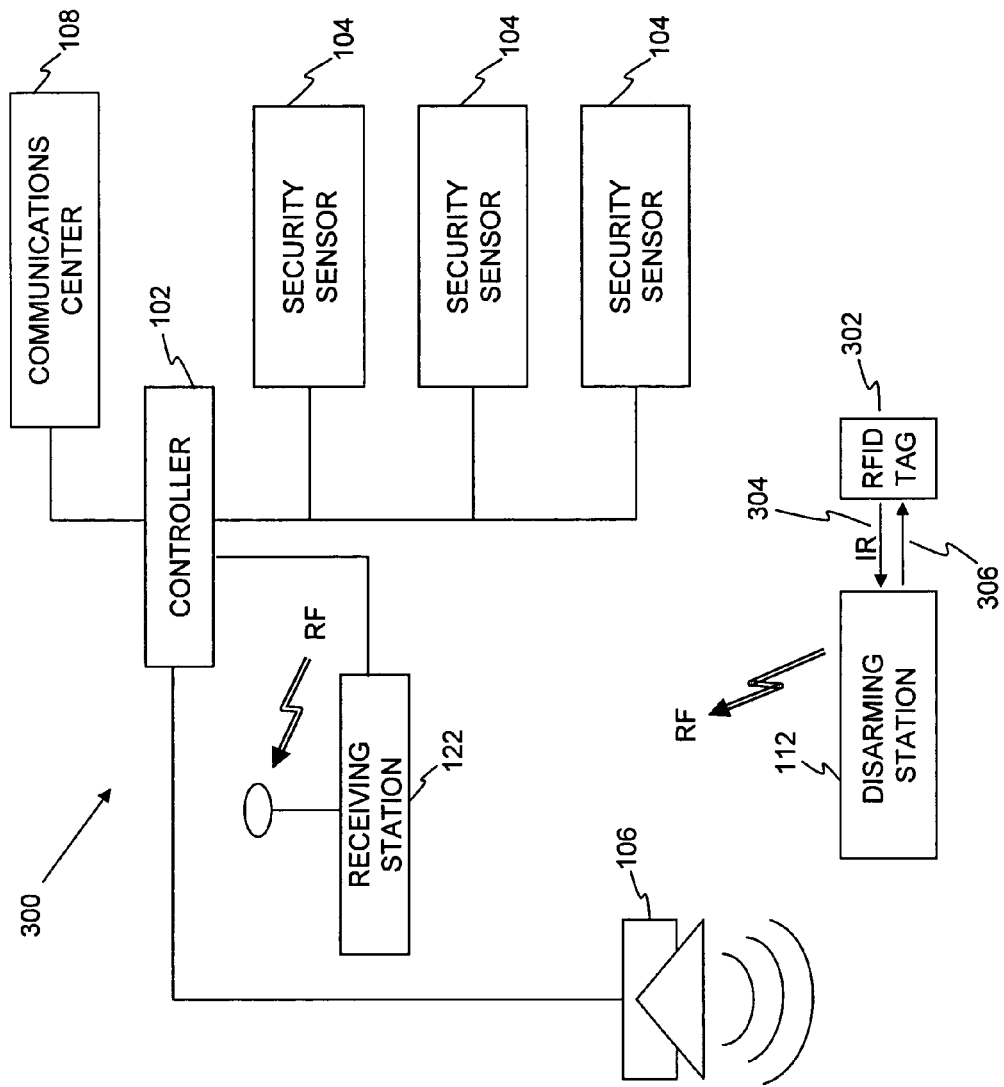
FIG. 4 is a block schematic drawing of another security system configuration of the present invention.
Figure 5:
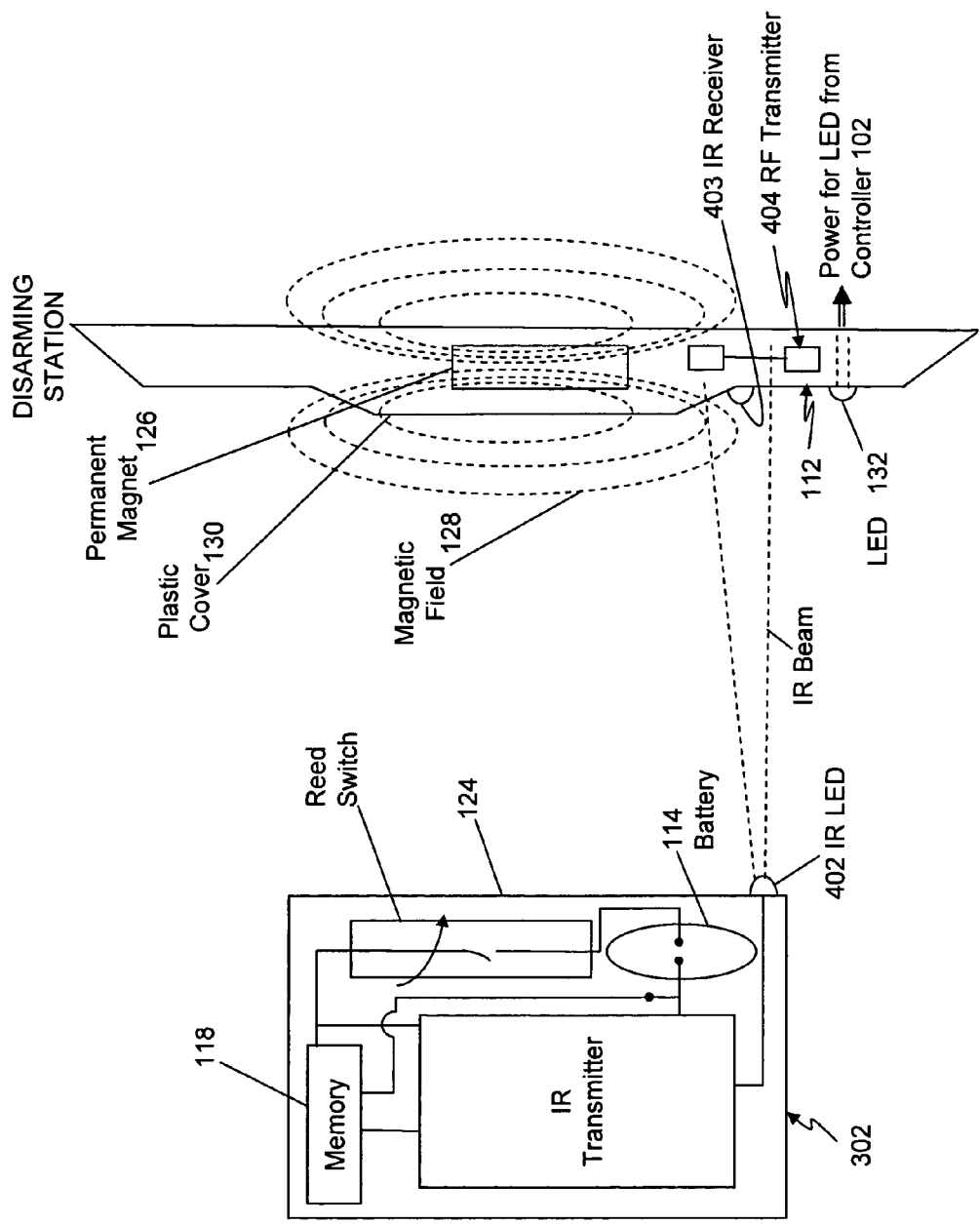
FIG. 5 is a more detailed pictorial diagram of an IRID card and disarming station useful in the security system configuration of FIG. 4.

In another configuration of the present invention and referring to FIG. 4, IRID tag 302 is activated by a magnet 126 in a disarming station 112, thereby resulting in an infrared signal 304 being transmitted from an infrared LED 402 shown in FIG. 5. Infrared signal 304 is encoded with a predetermined (i.e., authorized) signal (or one of several predetermined signals). When this signal is recognized by a receiver 403 in disarming station 112, disarming station 112 uses an internal transmitter 404 (shown in FIG. 5) to transmit a disarming signal to receiving station 122, which sends an appropriate signal to controller 102 to disarm system 300. In some configurations, infrared signal 304 is repeated while IRID tag 302 is within the magnetic field of permanent magnet 126 until a confirmation signal 306 is sent back to IRID tag 302. Confirmation signal 306 could be another IR signal transmitted to an IR receiver in IRID tag that is among the circuits activated by magnetic switch or sensor 124 or any other suitable type of signal. Other than these differences, the configuration illustrated in FIG. 4 can operate similarly to the configuration illustrated in FIG. 1.

Both IRID tags 302 and RFID tags 110 can be used in a single system. However, in such configurations, disarming stations 112 suitable for use with IRID tags 302 should either be clearly marked or all disarming stations 112 should be suitable for use with IRID tags 302.

It will thus be appreciated that configurations of the present invention can provide a security system having a long-lasting RFID tag that can transmit a signal a substantial distance and yet last almost as long as the shelf life of the batteries used to power it. Because the batteries last throughout the useful life of the RFID tag, the tag becomes disposable at the end of life and there is no need to change batteries. Moreover, instead of having multiple readers for the RFID tags, a single receiving station (or a small number of receiving stations) can be used, and active disarming stations can be replaced with completely passive disarming stations comprising a permanent magnet. As an alternative to replacement, existing disarming stations can be retrofitted with magnets.

While the invention has been described in terms of various specific embodiments, those skilled in the art will recognize that the invention can be practiced with modification within the spirit and scope of the claims.

What is claimed is:

1. A disarming system for an RFID tag or an IRID tag having one or more of a magnetically operated sensor and a magnetically operated switch, said disarming system comprising:
  a permanent magnet configured to activate at least one of the magnetically operated switch and the magnetically operated sensor in the RFID tag or IRID tag when the RFID tag or IRID tag is brought into proximity of said permanent magnet; and
  a receiving station configured to disarm a security system when the at least one of the magnetically operated switch and the magnetically operated sensor in the RFID tag or IRID tag is activated.

2. A disarming system in accordance with claim 1 having a plurality of passive disarming stations installed in a building along with the receiving station, and wherein the receiving station is configured to disarm the security system when the at least one of the magnetically operated switch and the magnetically operated sensor is activated by one or more of said disarming stations.

3. A disarming system in accordance with claim 1, wherein the receiving station is a wireless receiving station.

4. A security system comprising:
  a security controller configured to signal an alarm in response to a detection of an anomalous condition;
  at least one security sensor configured to indicate to said security controller that the anomalous condition has been detected;
  at least one RFID tag or IRID tag, said RFID tag or IRID tag comprising a transmitter, a memory containing data and operatively coupled to said transmitter to transmit said data, and a power source operatively coupled to the transmitter and memory through at least one of a magnetically operated switch and magnetically operated sensor to provide power to the transmitter and memory when the magnetically operated switch is in a sufficiently strong magnet field;
  at least one disarming station comprising a permanent magnet configured to operate the at least one of the magnetically operated switch and the magnetically operated sensor when the RFID tag or IRID tag is brought nearby; and a receiving station configured to receive the transmitted data from the RFID tag or IRID tag to disarm the security controller.

5. The security system of claim 4 wherein the at least one of the magnetically operated switch and magnetically operated sensor comprises a reed switch and the RFID tag or IRID tag further comprises an antenna operatively coupled to the transmitter to radiate a transmitted signal.

6. The security system of claim 4 wherein the at least one of the magnetically operated switch and magnetically operated sensor comprises a Hall effect sensor.

7. The security system of claim 4 wherein the transmitter comprises an infrared LED.

8. The security system of claim 4 wherein said transmitted data comprises a unique serial number of the RFID tag or IRID tag.

9. The security system of claim 4 wherein said transmitted data comprises a disarm code.

10. The security system of claim 4 wherein said disarming station is unpowered.

11. The security system of claim 4 wherein the RFID tag or IRID tag comprises an IRID tag with an infrared LED transmitter configured to transmit an authorized identification signal, and the disarming station further comprises an infrared optical receiver and a radio transmitter configured to disarm the security controller when the authorized identification signal is received by the infrared optical receiver.

12. The security system of claim 4 wherein said disarming station further comprises an indicator to indicate at least one of an armed and a disarmed status of the security system.

13. The security system of claim 4 wherein the magnet is retrofitted into an existing disarming system.

14. The security system of claim 4 wherein the disarming station further comprises a non-magnetic cover covering said permanent magnet.

15. A method for operating a security system having a security controller configured to signal an alarm in response to a detection of the anomalous condition, and at least one security sensor configured to indicate to said security controller that an anomalous condition has been detected, said method comprising:

bringing an RFID tag or IRID tag into proximity of a disarming station comprising a permanent magnet having a magnetic field;

operating at least one of a magnetically-operated switch and a magnetically-operated sensor in the RFID tag or IRID tag using the magnetic field of the permanent magnet to thereby temporarily awaken the RFID tag or IRID tag into a full power mode;

transmitting a signal from the temporarily awakened RFID tag or IRID tag to a receiver to disarm the security controller; and removing the RFID tag or IRID tag from the proximity of the disarming station to thereby place the RFID tag or IRID tag into at least one of a lower power dormant state and a no power dormant state.

16. The method of claim 15 wherein said operating operation comprises switching a reed switch.

17. The method of claim 15 wherein said operating operation comprises operating a Hall effect sensor.

18. The method of claim 15 wherein said transmitting operation comprises transmitting a radio signal to a receiver in the security controller.

19. The method of claim 15 wherein said transmitting operation comprises transmitting an infrared signal from an infrared LED to an optical infrared receiver in the disarming station and further transmitting a radio signal from the disarming station to the security controller.

20. The method of claim 15 wherein said transmitting a signal from the temporarily awakened RFID tag or IRID tag comprises transmitting a unique serial number of the RFID tag or IRID tag.

21. The method of claim 15 wherein said transmitting a signal from the temporarily awakened RFID tag or IRID tag comprises transmitting a disarm code.

22. The method of claim 15 wherein said disarming station is unpowered.

23. The method of claim 15 further comprising indicating at least one of an armed and a disarmed status of the security system at the disarming station.

24. The method of claim 15 further comprising retrofitting the permanent magnet into an existing disarming system.

* * * * *